United States Patent
Rothman

(10) Patent No.: US 7,936,034 B2
(45) Date of Patent: May 3, 2011

(54) MESA STRUCTURE PHOTON DETECTION CIRCUIT

(75) Inventor: Johan Rothman, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 292 days.

(21) Appl. No.: 11/547,258

(22) PCT Filed: Apr. 4, 2005

(86) PCT No.: PCT/FR2005/050208
§ 371 (c)(1),
(2), (4) Date: Jan. 29, 2007

(87) PCT Pub. No.: WO2005/101512
PCT Pub. Date: Oct. 27, 2005

(65) Prior Publication Data
US 2007/0158664 A1    Jul. 12, 2007

(30) Foreign Application Priority Data

Apr. 5, 2004  (FR) .................................... 04 50677

(51) Int. Cl.
*H01L 31/107*  (2006.01)
(52) U.S. Cl. ........ 257/438; 257/439; 257/440; 257/600; 257/E29.329; 257/E29.185
(58) Field of Classification Search .......... 257/437–444, 257/452, 600, E29.329, E29.185, 601
See application file for complete search history.

(56) References Cited

U.S. PATENT DOCUMENTS

| | | | |
|---|---|---|---|
| 4,625,226 A | 11/1986 | Antell | |
| 4,639,756 A | 1/1987 | Rosbeck et al. | |
| 5,113,076 A | 5/1992 | Schulte | |
| 5,192,695 A * | 3/1993 | Wang et al. | 438/87 |
| 5,559,336 A * | 9/1996 | Kosai et al. | 250/370.13 |
| 5,581,084 A | 12/1996 | Chapman et al. | |
| 5,654,578 A | 8/1997 | Watanabe | |
| 5,721,429 A * | 2/1998 | Radford et al. | 250/338.4 |
| 5,959,339 A * | 9/1999 | Chapman et al. | 257/440 |
| 6,034,407 A | 3/2000 | Tennant et al. | |
| 6,049,116 A | 4/2000 | Park et al. | |
| 6,803,557 B1 * | 10/2004 | Taylor et al. | 250/214.1 |
| 2002/0011640 A1 | 1/2002 | Bauer et al. | |
| 2002/0135869 A1 * | 9/2002 | Banish et al. | 359/350 |

FOREIGN PATENT DOCUMENTS

| | | |
|---|---|---|
| EP | 0 061 803 | 10/1982 |
| EP | 0 087 842 | 9/1983 |
| EP | 0 475 525 | 3/1992 |
| EP | 0 747 962 | 12/1996 |
| EP | 0 797 256 | 9/1997 |
| JP | 1 179467 | 7/1989 |
| JP | 5 291605 | 11/1993 |

* cited by examiner

*Primary Examiner* — Bradley K Smith
*Assistant Examiner* — Mohammad T Karimy
(74) *Attorney, Agent, or Firm* — Oblon, Spivak, McClelland, Maier & Neustadt, L.L.P.

(57) ABSTRACT

A MESA-type photonic detection device, including at least one first junction, which itself includes a first receiving layer and sides formed or etched in the receiving layer. These sides at least partially include a layer with a doping opposite the doping of the first receiving layer.

17 Claims, 8 Drawing Sheets

MESA STRUCTURE PHOTON DETECTION CIRCUIT

TECHNICAL FIELD AND PRIOR ART

This invention relates to the production of a circuit for detecting radiation, in particular infrared radiation, for a wavelength greater than 1 μm, for example.

Such a circuit is, for example, a photovoltaic circuit.

A detection circuit is presented in the form of a pixel matrix, in which each pixel has at least one photodetector. In the case of a multi-spectral detector, each pixel contains at least two photodetectors, sensitive to different wavelengths. The reading circuit assembled with a detection circuit forms a detection system.

Various technologies can be used for the photodetectors, these various technologies having various architectures and performances.

In IR detection, photovoltaic detectors are among the highest performing techniques, competing primarily with bolometric detectors or multiple quantum well detectors (MQWIP).

A pixel in a photovoltaic detection circuit contains at least one junction made of semiconductor materials having different dopings, for example, a p-n photodiode.

The semiconductor material can, for example, be of the Hg(1–x)CdxTe-type with a suitable composition for adjusting the cut-off wavelength of the detector, $\lambda_c$.

The detection circuit is designed so that each pixel detects the incident radiation on a surface associated with the pixel, which means that the photocarriers, created by the incident radiation inside the pixel, are received only by the junction associated with the pixel.

Electrical interference occurs if the photocarriers generated by a pixel are detected by a junction of an adjacent pixel.

In a known manner, the minimisation of these electrical interferences is ensured by the physical separation of the pixels, by etching trenches around the pixels. Each pixel in this case forms a "mesa".

In another, so-called "planar" approach, the junctions have a spatial extension limited to the inside of each pixel, but the pixels are not physically separated by the etching. The electrical interferences in this case are limited, due to a confinement phenomenon, but remain non-zero.

In mono-spectral or multi-spectral applications requiring low electrical interference, it is advantageous to use pixels in mesa form.

However, the etching of mesas causes a number of defects that impair the operation of the diodes.

The impairment is, in part, the result of poor control of the electrical properties of the surfaces of the mesa sides. This poor definition can cause leakage currents and fluctuations of the intra- and inter-diode optoelectronic properties.

In particular, the region of the junction is very sensitive to disturbances.

The defects caused by etching are, in general, greater for junctions defined in materials having narrow forbidden bandwidths and a cut-off wavelength of high value.

The "multi-spectral" photovoltaic detection circuits can be classified into two categories, depending on the configuration of the photodiodes in the pixels.

The "series" approach proposes using a structure in which the two diodes of a pixel, having wavelengths with different cut-offs, $\lambda 1$ and $\lambda 2$, for example $\lambda 1=5$ μm and $\lambda 2=10$ μm, are connected in series. The exact values of $\lambda 1$ and $\lambda 2$ are chosen according to the application of the detection circuit.

One embodiment of such a component is described in document U.S. Pat. No. 5,113,076A. The general principle of this approach consists of creating two p/n junctions that receive photocarriers generated in two semiconductor materials with different forbidden bandwidths, and, consequently, different cut-off wavelengths. The materials can, for example, be of the Hg(1–x)CdxTe-type with different Cd compositions.

Detection with different wavelength bands is possible for each junction, if the structure is arranged so that the junction, which receives the photocarriers of the material and having the shortest cut-off wavelength, $\lambda 1$, is closest to that of the photon source.

In a pixel matrix with the junctions in series, the pixels are physically separated so as to prevent an electrical short-circuit between the diodes and so that the receiving of each junction is localised. To do this, the pixels are generally etched in mesa form.

The advantage of the "series" approach is that it is necessary to use only one interconnection per pixel, to link the reading circuit with the detection circuit. A maximum pixel density, limited by the density of interconnections, is thus possible.

As for mono-spectral detectors in mesa form, the main disadvantage of the series approach lies in the defects caused by the etching of the mesas.

Another, so-called "independent", approach proposes using a stack of junctions in the pixel, in which the junctions are electrically connected independently or partially independently.

This independent approach is characterised by the use of two interconnections per pixel, which makes it possible to read the two junctions simultaneously, in time coherence. However, the doubling of the interconnections gives a minimum area limit that is greater than for the series approach.

DESCRIPTION OF THE INVENTION

This invention proposes a pixel structure, applicable in the mono- and bi-spectral case, which makes it possible to reduce the problems caused by etching, by controlling the electrical properties of the surfaces of the mesa sides. It is thus possible to produce diodes with greater reproducibility and fewer defects.

The invention makes it possible to improve the performance of photodiodes in a pixel matrix forming an infrared radiation detection circuit.

Each pixel contains at least one photovoltaic detector, consisting of two regions made of a semiconductor material with a different doping, forming a p-n diode.

The absorption of photons and the creation of photocarriers are, preferably, concentrated in one of the two regions, called the receiving region.

Each pixel contains at least one surface resulting from the etching of the semiconductor materials. According to the invention, to eliminate the problems caused by etching, the etched surfaces of the pixels have an opposite doping with respect to the receiving region.

The invention relates first to a photonic detection device, of the MESA-type, comprising at least one first junction, which itself comprises a first receiving layer, sides formed or etched in said receiving layer, characterised in that said sides comprise, at least partially, a doping layer opposite the doping of the first receiving layer.

For example, if the receiving region is p-doped, the etched surfaces are n-doped.

The device can also comprise a second layer of semiconductor material, with a type of doping different from that of the first receiving layer.

The doping layer, which covers the sides, can then form the first junction with the receiving layer or complete or prolong this first junction.

An electrical contact can be formed on the first layer or on the doping layer of the sides, or on the second layer of semiconductor material, with a type of doping that is different from that of the first receiving layer.

A device according to the invention can also comprise a second junction, in which sides are formed or etched.

The second junction comprises, for example, a second collective layer.

The sides formed in the second junction may not comprise a doping layer opposite the doping of the second receiving layer, or, by contrast, may at least partially comprise a doping layer opposite the doping of the second receiving layer.

The two junctions preferably have different cut-off wavelengths.

A barrier layer can be formed or placed between the first and second layer, the width of its forbidden band being greater than the widths of the forbidden bands of the two layers.

At least one barrier layer can be provided on a side of the first receiving layer.

This barrier layer can be in contact with, and have the same doping as, the receiving region.

Preferably, it has a forbidden bandwidth that is greater than that of the first receiving layer.

The presence of this barrier makes it possible to prevent the presence of the end of a p-n junction at the interface between a material with a narrow gap and an insulator.

The barrier also makes it possible, in some embodiments of the invention, to reduce the electrical interferences.

A contact can be formed on the first receiving layer through the barrier layer.

The invention also relates to a method for producing a photonic detection device, of the MESA-type, comprising:
the formation of at least one first junction, itself comprising
a first receiving layer,
the formation of sides in this receiving layer, and, at the surface of the sides, a doping layer opposite the doping of the first receiving layer.

The junction can also comprise a second layer of semiconductor material, with a type of doping that is different from that of the first receiving layer.

A contact can be formed on the first layer.

The method can also comprise a step of forming an electrical contact with the second layer of semiconductor material.

A step of forming an electrical contact with the doping layer, formed at the surface of the sides, can also be performed.

The inversion of the sides can be performed by etching, or by implantation or diffusion.

The method can also comprise the formation of a second junction, in at least one second receiving layer and the formation of sides in said second receiving layer, at the surface of which a doping layer opposite the doping of the second receiving layer can be produced.

A step of forming a barrier layer can also be performed.

An electrical contact can be formed with the first receiving layer through the barrier layer.

DESCRIPTION OF SPECIFIC EMBODIMENTS

Figure 1:
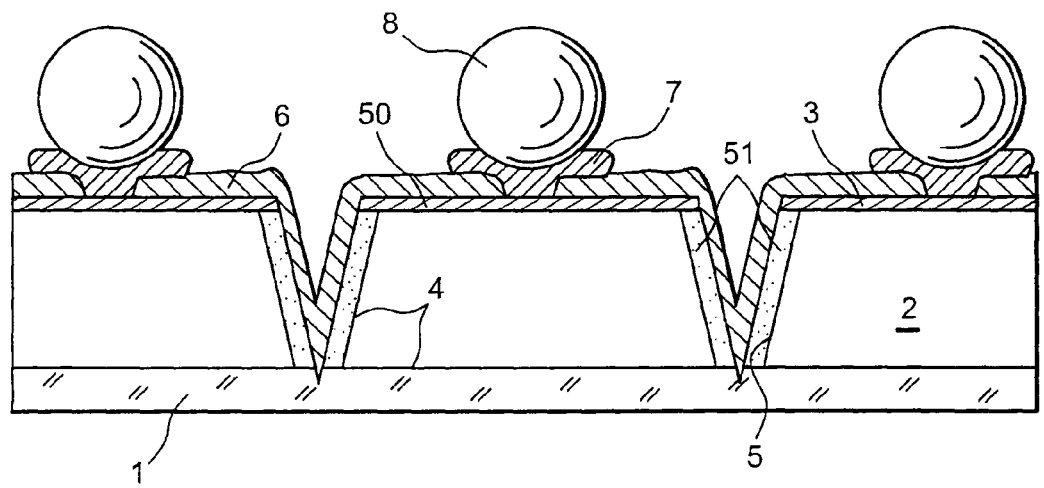
FIGS. 1 and 3 show embodiments of a device according to the invention.

A first mono-spectral embodiment of the invention is shown in FIG. 1.

In this embodiment, the pixels are in mesa form.

A junction is partially formed between a doped collecting region 2 and a layer 1 with a doping opposite that of region 2, located below the collecting region. The etching of the mesas is performed deeply enough to reach the lower layer 1: a junction that ends in the etched interface is poorly defined and can cause leakages at the surface; the deep etching in layer 1 makes it possible to avoid this situation.

Indeed, as the doping of the etched surfaces, and therefore the sides 5 of the mesas, is opposite that of the collecting region 2, the junction 4 can be extended continuously from the layer 1 to the surface 50 of the mesas.

The inversion of the doping of the sides with respect to that of the collecting layer 2 makes it possible to control the electrical properties of these sides and eliminate any disturbance in the receiving of the photocarriers.

Figure 2:
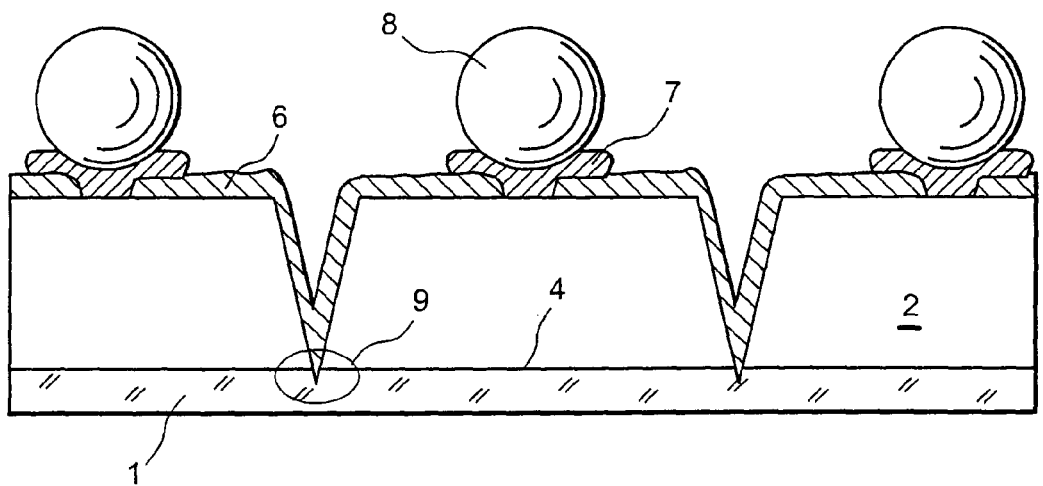
FIGS. 2 and 4 show devices known from the prior art.

In this embodiment, the invention also makes it possible to eliminate the presence of a junction that ends at an etched interface with poorly defined electrical properties, as shown by the encircled region 9 in FIG. 2, which shows a "mesa" structure according to the prior art. Such a junction can cause leakages between adjacent pixels or mesas.

A barrier layer 3 is, in this embodiment of the invention, placed above the collecting layer 2, so that the junction, formed between the etched surfaces and the collecting region 2, ends, at the top of the structure, in a region forming a barrier to the carriers. This prevents the junction from ending at the interface between a small-gap semiconductor and an insulator.

If the layer 2 has a composition of $Cd_xHg(1-x)Te$, for example, with $0.2<x<0.3$, the barrier region 3 can also have a composition of $Cd_xHg(1-x)Te$, but with $x>0.5$. A progressive transition between the composition of layer 2 and the barrier layer 3 can even be achieved. Such a variation in the composition modifies the value of the gap (or forbidden band), which modifies the electrical behaviour.

The pixels are protected by a passivation layer 6 and are connected to a reading circuit through a metal contact 7, and an indium ball 8.

Figure 3:
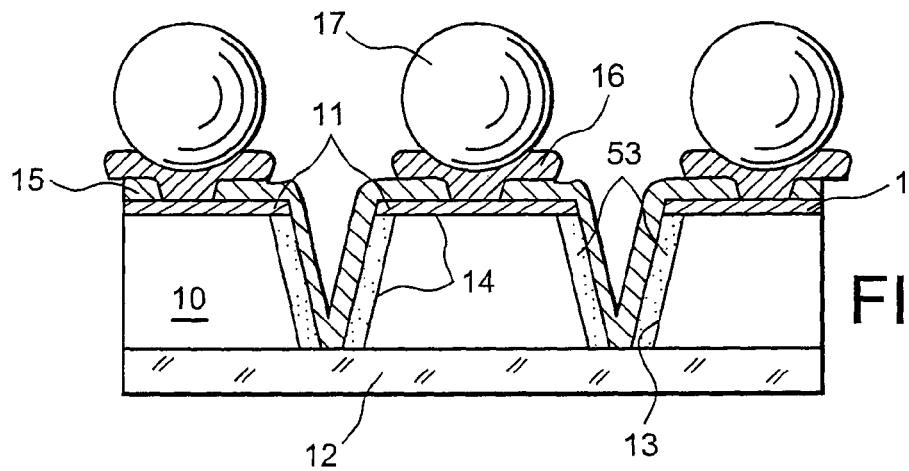

Another mono-spectral embodiment of the invention is shown in FIG. 3.

In this embodiment, the pixels are also in mesa form.

The junction is particularly formed between a doped collecting region 10 and a layer 11, having a type of doping opposite the type of doping of the collecting region 10, located above this collecting region.

The collecting region 10 is located above a doped barrier layer 12, with the same type of doping as the receiving region.

For example, regions 10 and 12 are both based on $Cd_xHg(1-x)Te$, for example, with $0.2<x<0.3$ for zone 10, and $x>0.5$ for layer 12. The resulting effect is that indicated above.

The etching of the mesas is performed deeply enough to reach the barrier layer 12.

The doping of layer 53 at the surface of the sides of the mesas 13 is inverted with respect to the doping of the collecting region 10. Thus, a junction 14 is formed, which extends from the surface of the mesas to the barrier layer 12.

The inversion of the type of doping of the sides 13, or of the layer 53 located on these sides, with respect to the type of doping of the collecting region 10, makes it possible to control the electrical properties of the sides and eliminate their influence on the collection of the photocarriers.

The barrier layer 12 makes it possible to terminate the junction, formed between the etched surfaces 13 and the collecting region 10, by a region with a high forbidden bandwidth, less sensitive to disturbances. It also makes it possible to reduce the electrical interferences between adjacent pixels or mesas.

The pixels are protected by a passivation layer 15 and are connected to a reading circuit through a metal contact 16, and an indium ball 17.

Figure 4:
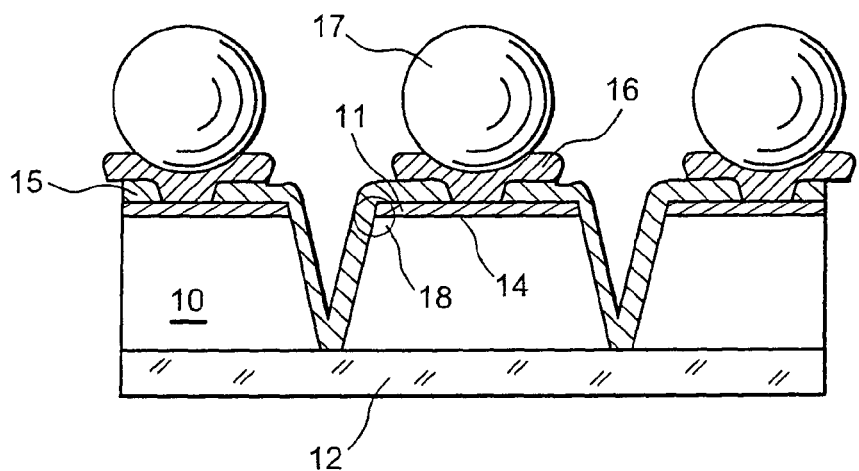

In this embodiment of FIG. 3, the invention also makes it possible to eliminate the presence of a junction near the etching, as shown by the encircled region 18 in FIG. 4, which corresponds to a device known from the prior art, in which there is no inversion of the doping of the etched surfaces with respect to the collecting region.

In a bi-spectral embodiment of the invention, each pixel in the matrix is constituted by two photodiodes having cut-off wavelengths $\lambda 2$ and $\lambda 1$ different from one another, and mutually connected in a head-to-tail series configuration, according to the series approach.

Figure 5:
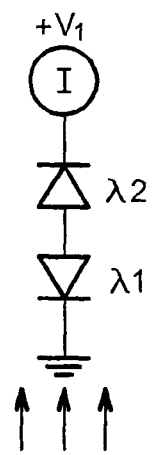
FIGS. 5-8 and 11 show "bi-spectral"-type devices according to the invention.

The equivalent circuit diagram of a bi-spectral pixel according to the invention is shown in FIG. 5, showing a pixel in n-p-n configuration, with incident radiation being represented by three arrows.

Figure 6:
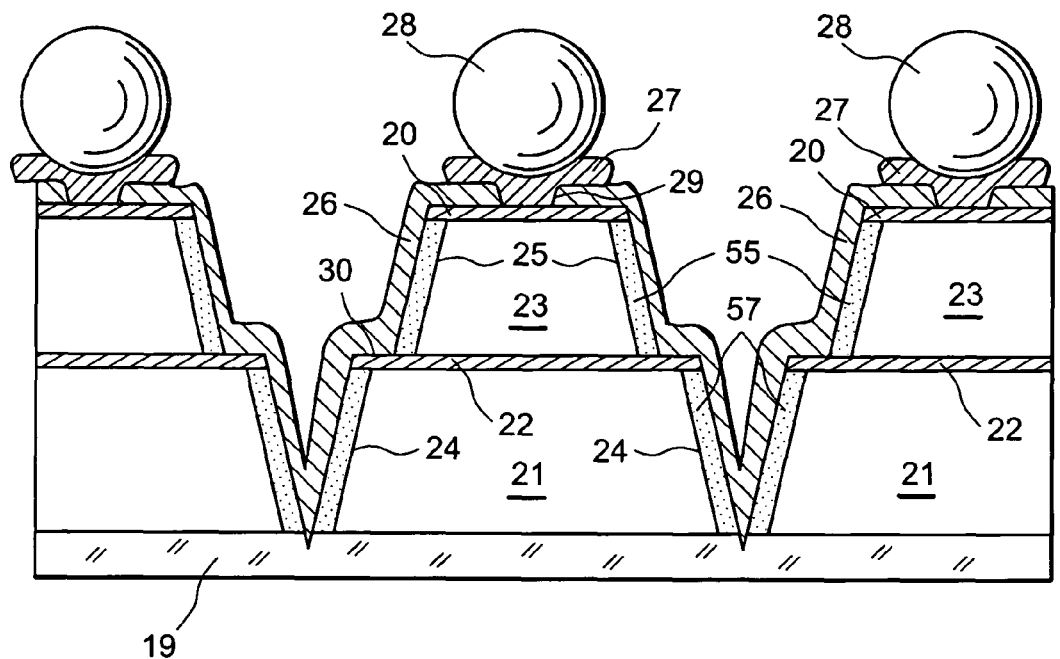

FIG. 6 shows such a bi-spectral embodiment of the invention, in n-p-n configuration.

A highly doped layer (here: n+) 19 is placed at the bottom of the structure and is intended to be closest to the photon source or turned toward this source.

This layer 19 forms a first p-n junction with a layer 21, having a type of doping opposite that of layer 19 (here: type p), having a cut-off length $\lambda 1$, for example $\lambda 1 = 5$ μm, resulting in the essential part of the collection of photocarriers of the first photodiode.

The layer 21 is separated from another layer 23, with the same type of doping as layer 21, receiving photocarriers, with a cut-off length $\lambda 2 > \lambda 1$, for example $\lambda 2 = 10$ μm. This separation is ensured by a barrier layer 22, (here: p-doped) and having a large gap.

A region 20, of the type of doping opposite that of layer 23, forms a junction with this layer 23, making it possible to receive the photocarriers resulting from radiation with a wavelength $\lambda$ in a band $\lambda 1 < \lambda < \lambda 2$.

The barrier layer 22 makes it possible to separate the collection of the photocarriers from the two junctions.

The layer 22 has the same type of doping as layers 21 and 23 (therefore either n or p), but with a larger gap than the gaps of layers 21 and 23. Layer 22 is conductive, but with a potential barrier (created by the gap) making it possible to prevent the carriers created in layer 21 (and 23, respectively) from being collected by layer 23 (and 21, respectively).

The structure is passivated with an insulator 26 having openings 29 that make it possible to form electrical contacts with the region 20 by deposition of a metal 27. The interconnection with a reading circuit is performed, for example, with indium balls 28 in contact with the metallic deposit 27.

According to the invention, the electrical properties of the materials on sides 24 and 25 are controlled by inverting the doping of these materials with respect to the collecting regions 21 and 23.

The inversion can be achieved by etching or by implantation.

In the embodiment proposed in FIG. 6, there are thus two junctions per pixel.

For the pixel of the band $\lambda 1$, the junction formed between layers 19 and 21 thus extends over the sides, to the barrier 22.

For the pixel of the band $\lambda 2$, the junction formed between layers 20 and 23 extends to the barrier 22.

The two junctions are separated by the barrier region 22, having a type of doping not inverted with respect to that of layers 21 and 23.

The electrical properties of the peripheral surface 30 of this non-inverted region are preferably well controlled, since the two junctions are close to one another. This control is simplified since this zone 30 is located in a large-gap layer (the barrier layer 22).

According to the invention, the extension of the junction by inversion of the sides makes it possible to obtain a gain in performance in terms of dispersion of currents and reduction of defects.

For pixels with a non-inverted etched surface, the reflectivity and entrapment of the photocarriers varies from one pixel to another, thus creating the dispersion.

In this invention, however, the junction formed by the inverted surface will collect all of the incident photocarriers on the sides of the mesas. The current dispersion is therefore reduced by the control and by the inversion of the electrical properties of the sides.

The invention also makes it possible to reduce leakage currents that can be generated in a non-inverted structure, if the junction extends to a region where the electrical properties are poorly controlled.

The control of the electrical properties of the sides of the "bottom" diode (junction 19-21 in FIG. 6) is generally less critical due to the greater stability of the materials with a shorter cut-off length. The invention therefore also relates to an embodiment in which the doping of the mesa sides 24 of the "bottom" diode (junction 19-21) is not inverted.

Figure 7:
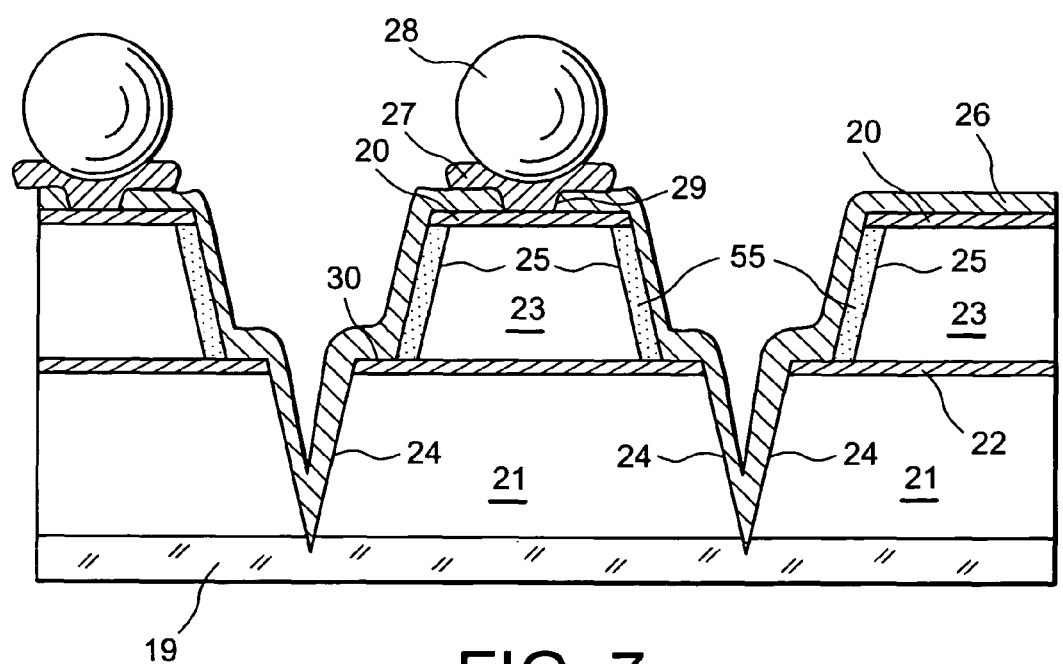

Such an embodiment is shown in FIG. 7. This solution makes it possible to relax the constraints on the production of pixels.

Only the mesa sides of the layer 23 are covered with a layer 25 of which the doping is inverted with respect to that of said layer 23.

According to yet another bi-spectral embodiment of the invention, a metallic contact is formed on the mesa side, thus making it unnecessary to form an n-region, or a region having a doping inverted with respect to that of the collecting layer 23, at the top of the mesa.

Figure 8:
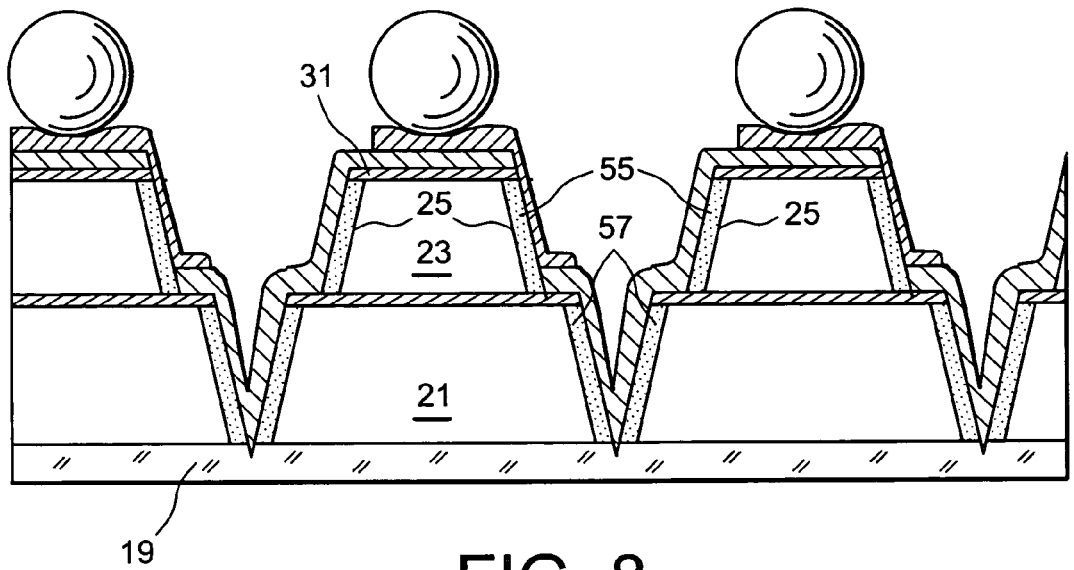

Such an embodiment is shown in FIG. 8.

In this case, region 20 (n-doped in this example) of FIG. 6 is replaced by a barrier layer 31 (p-doped in this example), therefore with the same type of doping as the collecting layer 23, but with a larger gap.

For example, if we return to the compositions of $Cd_xHg_{(1-x)}Te$ mentioned above, the barrier layer 31 can have a doping x of Cd (for example with x>0.5) greater than that of layer 23, for example with 0.2<x0.3.

The contact is formed on the side 25 of the mesa, with the layer 55 that covers this side and that has the type of doping opposite that of the collecting layer 23: the detection diode is then formed by the collecting layer 23 and by layer 55, which covers the side of the mesa. This embodiment is also possible in a mono-spectral situation.

According to yet another embodiment of the invention, the dopings of the different regions are inverted: for all of the embodiments explained, it is possible to invert the types of doping indicated for all of the layers.

The material used can be $Hg_{(1-x)}Cd_xTe$.

Other examples of materials usable for detectors are III-V semiconductors (InAs(1-x)Sbx, Ga(1-x)InxSb or Ga(1-x)InxAs(1-y)Sby) or IV-VI semiconductors (Pb(1-x)SnxTe or Pb(1-x)SnxSe).

The width of the forbidden band and the cut-off wavelength vary according to x. In HgxCd(1-x)Te with 77K, compositions x=0.225 and x=0.3 give gaps Eg=0.12 eV and Eg=0.24 eV corresponding to cut-off wavelengths of 10 µm and 5.1 µm respectively.

The barrier can, in the case of HgxCd(1-x)Te, have a forbidden bandwidth of Eg>0.6 eV, corresponding to a Cd composition of x>0.52.

The connection is not necessarily by ball bonding. It is possible to connect the circuit by wire or by molecular bonding or by any other technique.

An example of the production of a mono-spectral detector, as shown in FIG. 3, will now be provided.

The productions steps are shown in FIGS. 9A to 9F. It is noted that these steps are also applicable to the production of the top diodes (the band λ2, of a bi-spectral detector as shown in FIGS. 6 to 8).

In the first step (FIG. 9A), a resin 100 is deposited, and developed with trenches, on a heterostructure including at least three different layers: a barrier layer 120, a receiving layer 102 and, at the top, a layer 110 with the type of doping opposite that of the collecting layer 102.

The structure defined by the resin mask is, in a second step, transferred to the heterostructure by etching. This structure reaches the barrier 120 (FIG. 9B).

If the receiving layer 102 is of the p-type, the etching can cause an inversion of the doping of sides 130 and 140 of the resulting mesas, but also of the base 132 and 142 of the trenches in the barrier 120.

Therefore, at the surface of the sides, layers, of which the type of doping is inverted with respect to the type of doping of the receiving layer 102, are obtained.

Figure 9A:
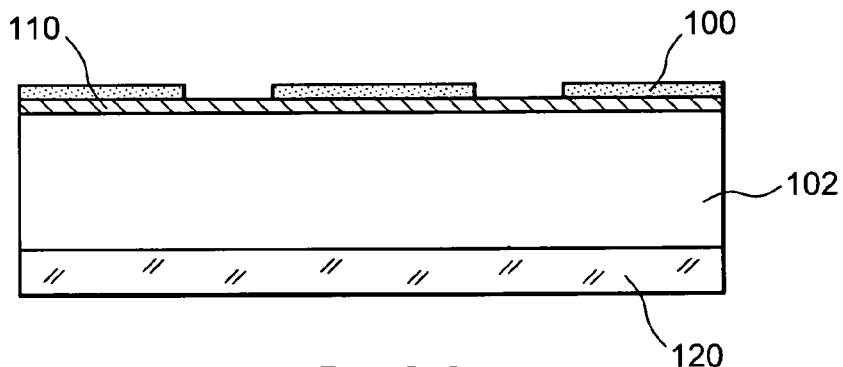
FIGS. 9A to 10C show steps for producing devices according to the invention.
Figure 9B:
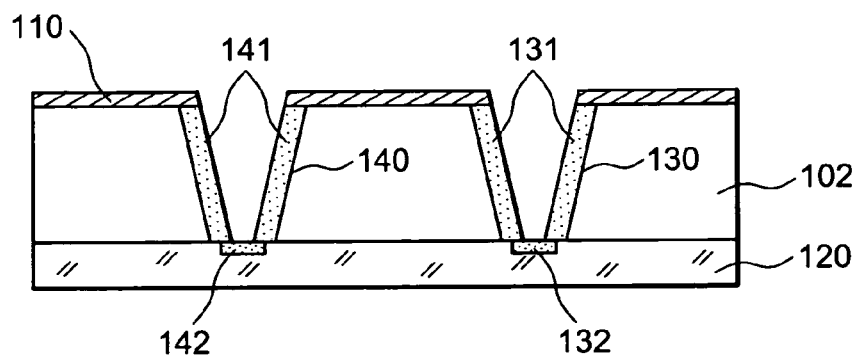

The result, after the second step, is shown in FIG. 9B. The inversion of the doping of the sides and trenches can, alternatively, by induced by implantation, for example of boron, or indium or arsenic, or by diffusion, for example of mercury or tellurium.

Figure 9C:
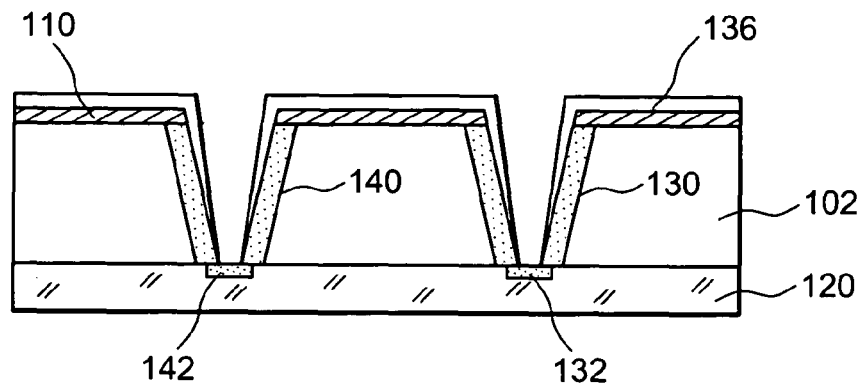

In a third step, (as shown in FIG. 9C) a resin 136 is deposited on the assembly previously obtained, and developed so as to etch the base of the trenches.

The inverted doping material 132, 142, located at the base of the trenches, is then removed by etching, which makes it possible to best preserve the electrical properties of the exposed surfaces, in particular the doping of the sides.

Figure 9D:
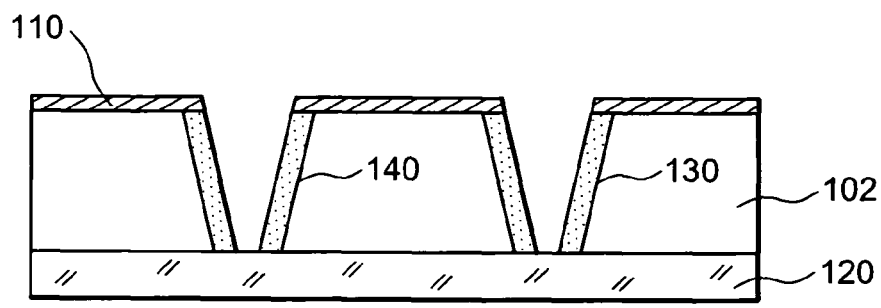

FIG. 9D shows the structure after the etching of the bases of the trenches and removal of the resin 136.

Figure 9E:
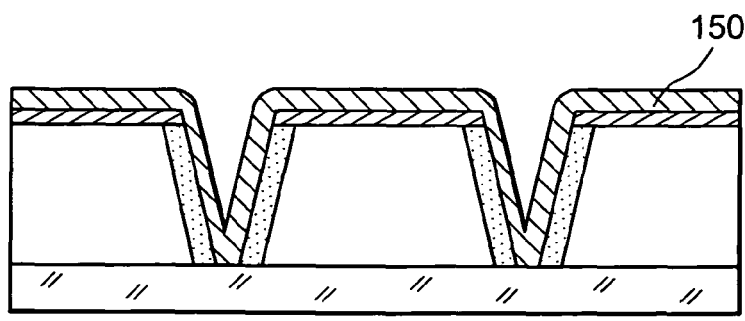

A deposition of an insulator 150 then makes it possible to passivate the structure, as shown in FIG. 9E.

Figure 9F:
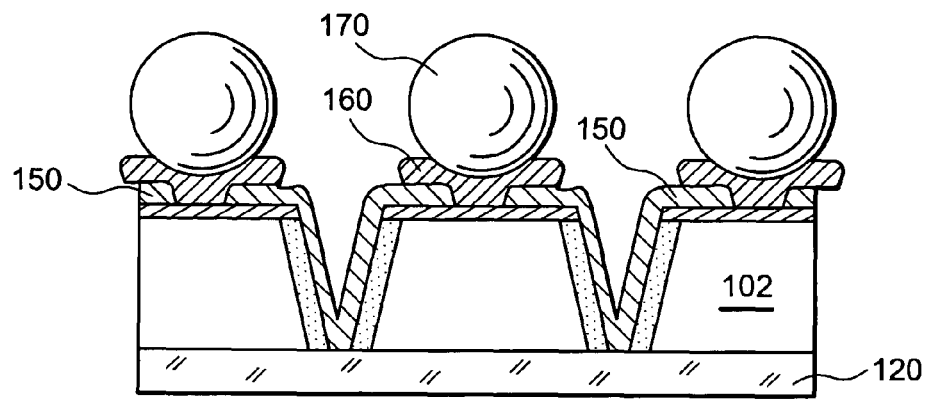

In a final step, the insulator 150 is opened to allow for contact with the diode by the deposit, as well as the structuration of the metallic contacts 160, 170 (FIG. 9F).

The production of a bi-spectral detector follows the same steps shown in FIGS. 9A to 9F in order to produce the diode of the band λ2.

Figure 10A:
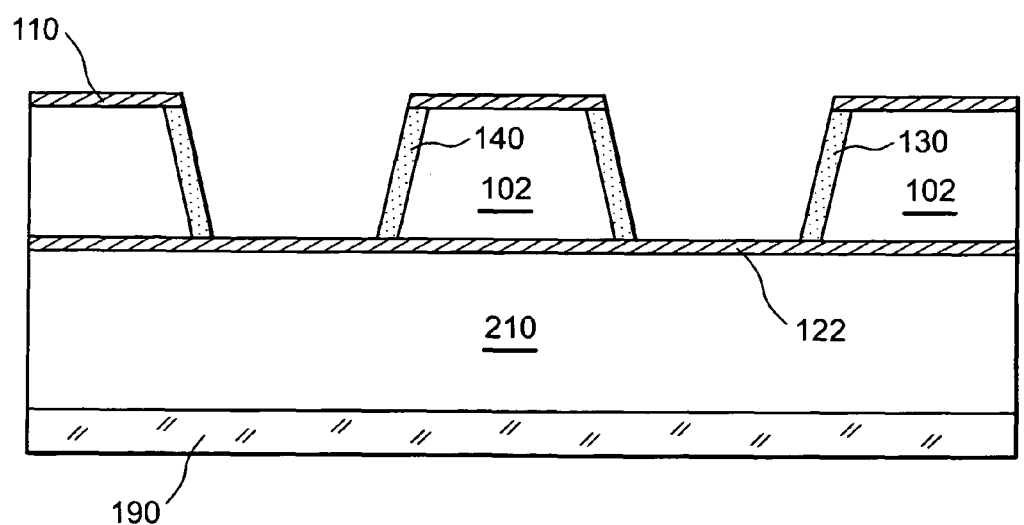

FIG. 10A shows a multi-spectral structure after these steps.

Figure 10B:
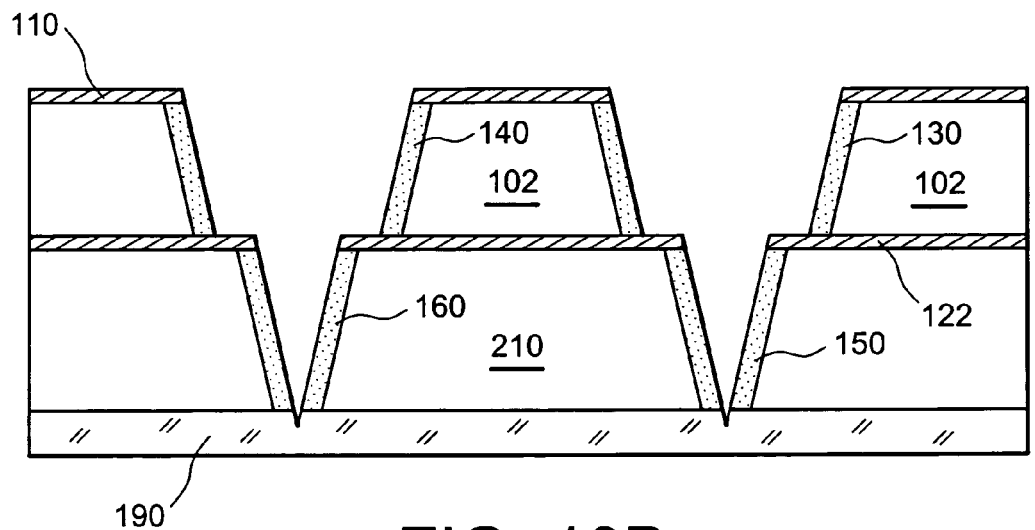

The trench is then deepened (FIG. 10B) by etching so as to reach a base layer 190, through a collecting layer 210 of semiconductor material. The etching is, for example, an etching that makes it possible to invert the doping of the sides 150, 160 of the mesas of the bottom diode.

This is formed by layer 190 and layer 210, which have mutually opposite doping types.

Figure 10C:
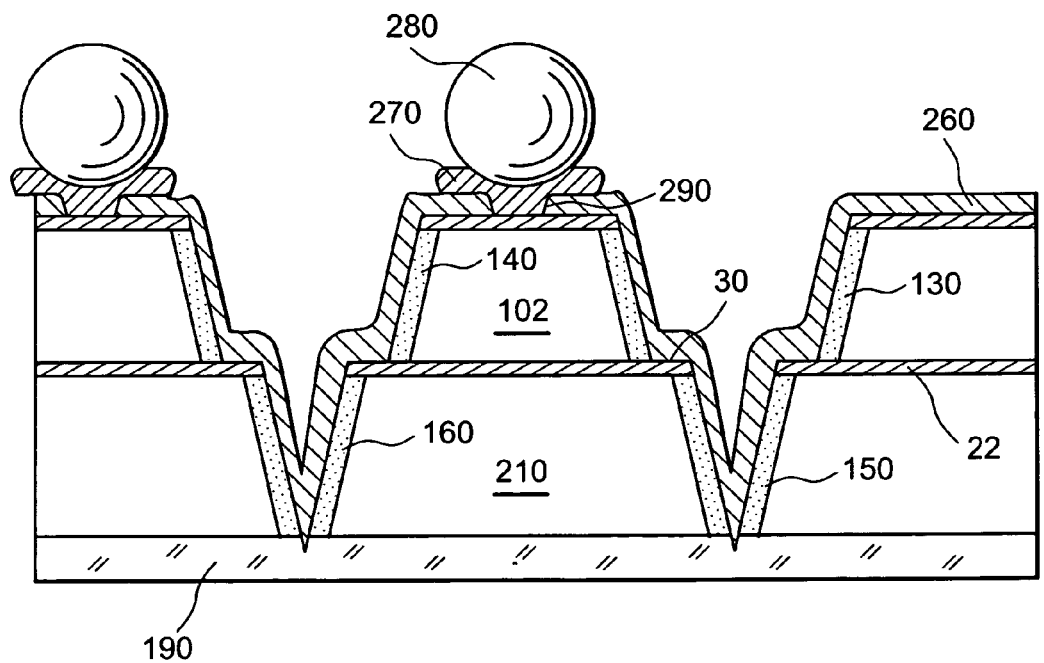

The pixels are then passivated by the deposition of an insulator 260 (FIG. 10C). A metallic structure 270 and electrical contact means such as indium balls 280 allow for the contact with the diodes of the band λ2, through an opening 290 in the insulator (FIG. 10C).

According to an alternative, it is possible to form electrical contacts on the sides of the top diode, as shown in FIG. 8.

The invention makes it possible to improve the performance and efficiency of an infrared radiation detection circuit, constituted by pixels with etched surfaces and with at least one photodiode per pixel.

An improvement in performance is achieved by inversion of the doping of the etched surfaces with respect to the collecting region and the use of at least one barrier layer, which makes it possible to obtain a more uniform pixel assembly, with fewer defects and less noise.

In all of the embodiments of the invention described above, means for supplying power to the diodes are provided, but not shown in the figures.

Similarly, a second contact is formed, for example on the side of the substrate 1, 12, 19, 120, 190, the first contact capable of being formed, depending on the case, directly on the first collecting layer 2, 10, 23, 102 (possibly through the barrier layer), on the doping layer 51, 53, 55, 130, 131 covering the sides, or on the second layer of semiconductor material 1, 11, 20 forming the first junction with the first collecting layer.

The invention in particular proposes means for producing a bi-spectral photovoltaic detector with two junctions in series, in mesa form, of which the electrical properties of the sides are controlled by doping of the type opposite that of the collecting layers in the mesa.

The embodiments described above make it unnecessary to terminate the junctions on the sides of the mesas or in a small-gap region.

The invention also makes it possible to eliminate the bad influence of a poorly defined surface state on the sides of the mesas, which surface state can contribute to a dispersion of the photonic current and the dark current.

The embodiment of FIG. 6, however, presents the problem of separation between layers 21 and 23 of this figure, at the level of layer 22.

Figure 11:
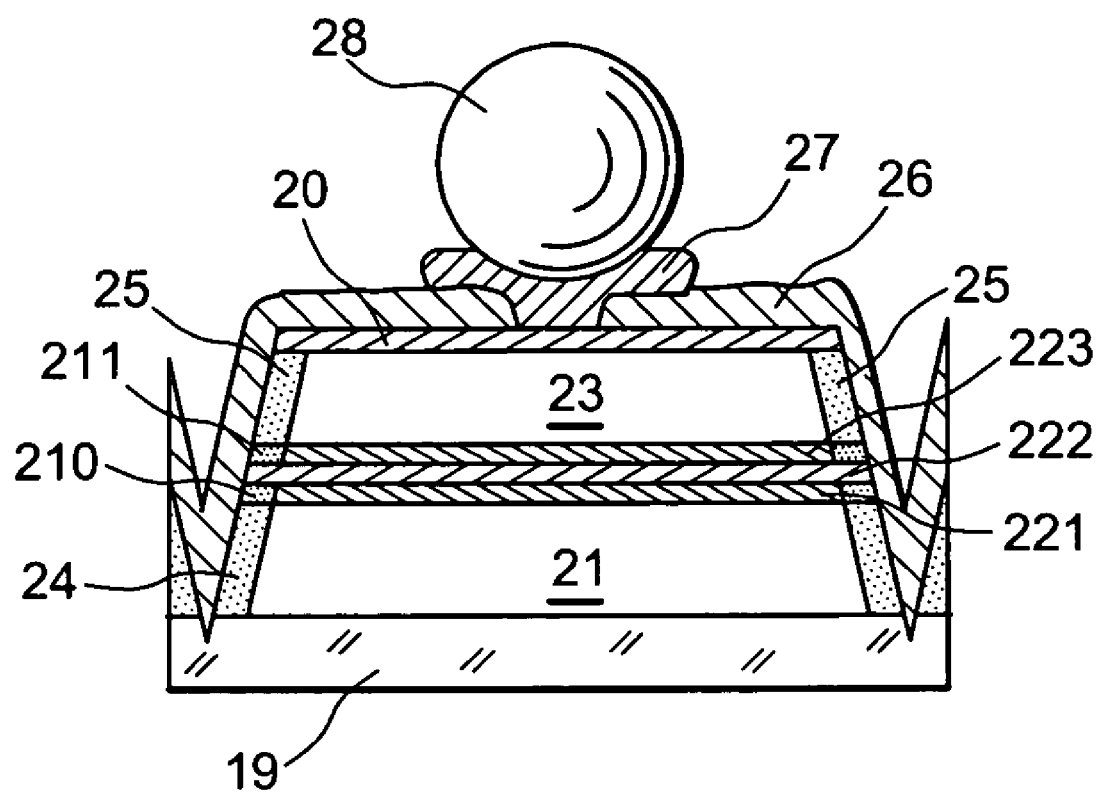

Another embodiment of the invention is shown in FIG. 11, which enables this problem to be solved.

The electrical insulation of the two layers 21 and 23 is achieved not by a physical separation, but by adapted dopings.

More specifically, a series of 3 layers 221, 222, 223 replaces layer 22.

The gap of each of these 3 layers is greater than the gap of layers 21 and 23, and the gap of the central layer 222 is greater than the gap of lateral layer 221 and that of lateral layer 223.

The doping of the sides 24, 25 is opposite the doping of layers 221, 222, 223, 21 and 23; in absolute value, the dopings of these latter ones are lower than the doping of the sides 24, 25, which is itself lower than that of layer 222.

The production of this device thus involves the following steps.

In a first growth step:

a) the production of a first highly doped semiconductor layer 19 (for example n+), preferably having a gap larger than the radiation to be detected, b) the formation of two layers 21 and 23 for collecting photocarriers, with a doping opposite that of layer 19 and separated by a barrier region constituted by three layers 221, 222, 223 with the same type of doping as layers 21 and 23, wherein the gaps of these different layers satisfy the relative conditions indicated above. Layers 221 and 223 have a doping level on the same order of magnitude as the doping level of layers 21 and 23. Layer 222 has a doping level higher than that of layers 21, 221, 223 and 23.

c) a layer 20 with a doping opposite that of layer 23. This layer can also be created by implantation of doping agents.

In a second step, individual detectors in mesa form are then formed by a single etching step. The etching reaches layer 19.

The sides of the mesas are then electrically inverted to form regions 24, 25 having the same doping as layers 19 and 20. The inversion of the sides can be performed by ion implantation or in the etching step.

In absolute value, the level of doping of the sides is greater than the level of doping in the layers 21, 221, 223 and 23, but lower than the level of doping of layer 222, so that the p-n junctions 24, 25, that extend over the mesa sides stop in a large gap material (layers 221 or 223—zones 210 or 211, respectively), but do not pass through the barrier layer 222, due to the doping of the latter.

This embodiment allows for a simple implementation of the invention, using a single etching step, as well as an alignment of the etching patterns and a less critical implantation.

The mesas can be encapsulated by an insulating material 26, enabling the detector to be chemically, electrically and mechanically stabilized. An electrical contact is finally formed with a metallic deposition 27 through an opening in the insulator, allowing for the connection with a reading circuit, for example by using an indium ball 28.

In an alternative, the gap of layers 221 and 223 has a gradient, enabling the gap to be opened gradually, passing through layers 21 and 23 to layer 222.

The invention claimed is:

1. A MESA-type photonic detection device comprising:
   at least one first junction that includes a first collecting layer that is p-type or n-type;
   first lateral sides formed within said collecting layer that at least partially include a doping layer with a doping opposite the doping of the first collecting layer;
   a second junction in which second lateral sides are formed or etched, said second junction being in series with the first junction, wherein the second junction includes a second collecting layer, the second lateral sides are within the second collecting layer, and the second junction is above or below the first junction; and
   a barrier layer disposed between the first and second collecting layers.

2. A device according to claim 1, further comprising a second layer made of a semiconductor material, with a type of doping opposite that of the first collecting layer.

3. A device according to claim 2, wherein the second lateral sides included in the second junction do not include a layer with a doping opposite a doping of the second collecting layer.

4. A device according to claim 2, wherein the second lateral sides included in the second junction at least partially include a layer with a doping opposite a doping of the second collecting layer.

5. A device according to claim 2, wherein a width of a forbidden band of the barrier layer is greater than widths of forbidden bands of said first and second collecting layers.

6. A device according to claim 5, wherein said barrier layer has a same type of doping as the first collecting layer.

7. A device according to claim 5, wherein said barrier layer has a type of doping opposite that of the first lateral sides of the first collecting layer.

8. A device according to claim 2, wherein electrical insulation between the first and second collecting layers is achieved through doping.

9. A device according to claim 2, wherein the barrier layer includes an assembly of 3 layers, including a central layer and two lateral layers, a band gap of the central layer being greater than a band gap of each of the lateral layers, the band gap of each of these 3 layers being greater than a band gap of the first and second collecting layers, said 3 layers having a doping opposite that of the doping layer of the first lateral sides.

10. A device according to claim 9, wherein the doping of the lateral layers and the first and second collecting layers being less than the doping of the first lateral sides, and the doping of the first lateral sides is less than the doping of the central layer.

11. A device according to claim 9, wherein the band gap of the lateral layers includes a gradient, making it possible to open or adapt the band gap of the lateral layers gradually by passing the first and second collecting layers to the central layer of the assembly of 3 layers located between the first and second collecting layers.

12. A device according to claim 2, wherein
   the barrier layer is sandwiched between the first collecting layer and the second collecting layer beneath a top surface of a mesa of the device.

13. A device according to claim 2, further comprising an electrical contact formed on the second layer of semiconductor material, with a type of doping different from that of the first collecting layer.

14. A device according to claim 1, wherein the doping layer of the first lateral sides forms the first junction with the first collecting layer or completes or prolongs the first junction.

15. A device according to claim 1, further comprising an electrical contact formed on the first collecting layer or on the doping layer of the first lateral sides, or on a second layer of semiconductor material, with a type of doping different from that of the first collecting layer.

16. A device according to claim 1, wherein the first and second junctions having different cut-off wavelengths.

17. A device according to claim 1, further comprising a passivation layer.

* * * * *